(12) United States Patent
Dittmann et al.

(10) Patent No.: US 7,891,988 B2
(45) Date of Patent: Feb. 22, 2011

(54) SYSTEM AND METHOD FOR CONNECTING FLAT FLEX CABLE WITH AN INTEGRATED CIRCUIT, SUCH AS A CAMERA MODULE

(75) Inventors: Larry E. Dittmann, Middletown, PA (US); John David Williams, Sunnyvale, CA (US); William B. Long, Cupertino, CA (US)

(73) Assignee: Neoconix, Inc., Sunnyvale, CA (US)

( * ) Notice: Subject to any disclaimer, the term of this patent is extended or adjusted under 35 U.S.C. 154(b) by 0 days.

(21) Appl. No.: 12/590,443

(22) Filed: Nov. 6, 2009

(65) Prior Publication Data

US 2010/0055941 A1 Mar. 4, 2010

Related U.S. Application Data

(63) Continuation of application No. 11/408,566, filed on Apr. 21, 2006, now Pat. No. 7,625,220, which is a continuation-in-part of application No. 11/265,205, filed on Nov. 3, 2005, now Pat. No. 7,114,961, which is a continuation-in-part of application No. 10/412,729, filed on Apr. 11, 2003, now Pat. No. 7,056,131.

(51) Int. Cl.
*H01R 12/00* (2006.01)
(52) U.S. Cl. .......................................... 439/77; 29/847
(58) Field of Classification Search .................. 439/67, 439/77; 29/847
See application file for complete search history.

(56) References Cited

U.S. PATENT DOCUMENTS

| | | | |
|---|---|---|---|
| 3,543,587 A | 12/1970 | Kawada | |
| 3,634,807 A | 1/1972 | Grobe et al. | |
| 3,670,409 A | 6/1972 | Reimer | |
| 4,087,146 A | 5/1978 | Hudson, Jr. | |
| 4,175,810 A | 11/1979 | Holt et al. | |
| 4,548,451 A | 10/1985 | Benarr et al. | |
| 4,592,617 A | 6/1986 | Seidler | |
| 4,657,336 A | 4/1987 | Johnson et al. | |
| 4,734,053 A | 3/1988 | Imai | |

(Continued)

FOREIGN PATENT DOCUMENTS

EP 1280241 A1 1/2003

(Continued)

OTHER PUBLICATIONS

Kromann, Gary B., et al., "Motorola's PowerPC 603 and PowerPC 604 RISC Microprocessor: the C4/Ceramic-ball-grid Array Interconnect Technology", *Motorola Advanced Packaging Technology*, Motorola Inc.,(1996),1-10 Pgs.

(Continued)

*Primary Examiner*—Ross N Gushi
(74) *Attorney, Agent, or Firm*—Kenneth A. Seaman

(57) ABSTRACT

A Flat Flex Connector (FFC) has connector flanges embedded in its insulated electrical traces. The flanges engage electrical circuits in a camera module such as a CMOS or CCD and are clamped into electrical engagement. The opposite end of the FFC makes electrical contact with another electrical device such as a semiconductor circuit. The assembly allows electrical connection of two or more devices in a confined space in which the electrical device are not easily aligned for electrical contact.

9 Claims, 8 Drawing Sheets

U.S. PATENT DOCUMENTS

| | | |
|---|---|---|
| 4,790,777 A | 12/1988 | Iimori et al. |
| 4,893,172 A | 1/1990 | Matsumoto et al. |
| 4,998,885 A | 3/1991 | Beaman |
| 5,053,083 A | 10/1991 | Sinton |
| 5,135,403 A | 8/1992 | Rinaldi |
| 5,148,266 A | 9/1992 | Khandros et al. |
| 5,152,695 A | 10/1992 | Grabbe et al. |
| 5,161,983 A | 11/1992 | Ohno et al. |
| 5,173,055 A | 12/1992 | Grabbe |
| 5,199,879 A | 4/1993 | Kohn et al. |
| 5,228,861 A | 7/1993 | Grabbe |
| 5,257,950 A | 11/1993 | Lenker et al. |
| 5,292,558 A | 3/1994 | Heller et al. |
| 5,299,939 A | 4/1994 | Walker et al. |
| 5,316,496 A | 5/1994 | Imai |
| 5,338,209 A | 8/1994 | Brooks et al. |
| 5,358,411 A | 10/1994 | Mroczkowski et al. |
| 5,366,380 A | 11/1994 | Reymond |
| 5,380,210 A | 1/1995 | Grabbe et al. |
| 5,423,687 A | 6/1995 | Laub |
| 5,468,655 A | 11/1995 | Greer |
| 5,483,741 A | 1/1996 | Akram et al. |
| 5,509,814 A | 4/1996 | Mosquera |
| 5,528,456 A | 6/1996 | Takahashi |
| 5,530,288 A | 6/1996 | Stone |
| 5,532,612 A | 7/1996 | Liang |
| 5,562,487 A | 10/1996 | Ii et al. |
| 5,575,662 A | 11/1996 | Yamamoto et al. |
| 5,590,460 A | 1/1997 | DiStefano et al. |
| 5,593,903 A | 1/1997 | Beckenbaugh et al. |
| 5,629,837 A | 5/1997 | Barabi et al. |
| 5,632,631 A | 5/1997 | Fjelstad et al. |
| 5,634,821 A | 6/1997 | Crane |
| 5,691,913 A | 11/1997 | Tsuchida et al. |
| 5,751,556 A | 5/1998 | Butler et al. |
| 5,772,451 A | 6/1998 | Dozier, II et al. |
| 5,791,911 A | 8/1998 | Fasano et al. |
| 5,802,699 A | 9/1998 | Fjelstad et al. |
| 5,812,378 A | 9/1998 | Fjelstad et al. |
| 5,842,273 A | 12/1998 | Schar |
| 5,860,585 A | 1/1999 | Rutledge et al. |
| 5,896,038 A | 4/1999 | Budnaitis et al. |
| 5,903,059 A | 5/1999 | Bertin et al. |
| 5,906,498 A | 5/1999 | Nagafuji |
| 5,911,597 A | 6/1999 | Oshitani |
| 5,934,914 A | 8/1999 | Fjelstad et al. |
| 5,938,453 A | 8/1999 | Ichimura |
| 5,956,575 A | 9/1999 | Bertin et al. |
| 5,967,797 A | 10/1999 | Maldonado |
| 5,967,850 A | 10/1999 | Crane |
| 5,980,335 A | 11/1999 | Barbieri et al. |
| 5,981,870 A | 11/1999 | Barcley et al. |
| 5,984,704 A | 11/1999 | Hashiguchi |
| 5,989,994 A | 11/1999 | Khoury et al. |
| 5,993,247 A | 11/1999 | Kidd |
| 6,000,280 A | 12/1999 | Miller et al. |
| 6,019,611 A | 2/2000 | McHugh et al. |
| 6,027,366 A | 2/2000 | Mori et al. |
| 6,029,344 A | 2/2000 | Khandros et al. |
| 6,031,282 A | 2/2000 | Jones et al. |
| 6,032,356 A | 3/2000 | Eldridge et al. |
| 6,042,387 A | 3/2000 | Jonaidi |
| 6,044,548 A | 4/2000 | Distefano et al. |
| 6,056,572 A | 5/2000 | Matsumoto et al. |
| 6,063,640 A | 5/2000 | Mizukoshi et al. |
| 6,072,323 A | 6/2000 | Hembree et al. |
| 6,083,837 A | 7/2000 | Millet |
| 6,084,312 A | 7/2000 | Lee |
| 6,089,904 A | 7/2000 | Wu |
| 6,133,534 A | 10/2000 | Fukutomi et al. |
| 6,142,789 A | 11/2000 | Nolan et al. |
| 6,146,151 A | 11/2000 | Li |
| 6,156,484 A | 12/2000 | Bassous et al. |
| 6,181,144 B1 | 1/2001 | Hembree et al. |
| 6,184,699 B1 | 2/2001 | Smith et al. |
| 6,191,368 B1 | 2/2001 | Di Stefano et al. |
| 6,196,852 B1 | 3/2001 | Neumann et al. |
| 6,200,143 B1 | 3/2001 | Haba et al. |
| 6,203,347 B1 | 3/2001 | Crane |
| 6,204,065 B1 | 3/2001 | Ochiai |
| 6,205,660 B1 | 3/2001 | Fjelstad et al. |
| 6,208,157 B1 | 3/2001 | Akram et al. |
| 6,218,848 B1 | 4/2001 | Hembree et al. |
| 6,220,869 B1 | 4/2001 | Grant et al. |
| 6,221,750 B1 | 4/2001 | Fjelstad |
| 6,224,392 B1 | 5/2001 | Fasano et al. |
| 6,250,933 B1 | 6/2001 | Khoury et al. |
| 6,255,727 B1 | 7/2001 | Khoury |
| 6,255,736 B1 | 7/2001 | Kaneko |
| 6,263,566 B1 | 7/2001 | Hembree et al. |
| 6,264,477 B1 | 7/2001 | Smith et al. |
| 6,293,806 B1 | 9/2001 | Yu |
| 6,293,808 B1 | 9/2001 | Ochiai |
| 6,297,164 B1 | 10/2001 | Khoury et al. |
| 6,298,552 B1 | 10/2001 | Li |
| 6,300,782 B1 | 10/2001 | Hembree et al. |
| 6,306,752 B1 | 10/2001 | DiStefano et al. |
| 6,315,616 B1 | 11/2001 | Hayashi |
| 6,332,801 B1 | 12/2001 | Watanbe |
| 6,335,210 B1 | 1/2002 | Farooq et al. |
| 6,336,269 B1 | 1/2002 | Eldridge et al. |
| 6,337,575 B1 | 1/2002 | Akram |
| 6,345,987 B1 | 2/2002 | Mori et al. |
| 6,352,436 B1 | 3/2002 | Howard |
| 6,361,328 B1 | 3/2002 | Gosselin |
| 6,373,267 B1 | 4/2002 | Hiroi |
| 6,374,487 B1 | 4/2002 | Haba et al. |
| 6,375,474 B1 | 4/2002 | Harper, Jr. et al. |
| 6,384,475 B1 | 5/2002 | Beroz et al. |
| 6,392,524 B1 | 5/2002 | Biegelsen et al. |
| 6,392,534 B1 | 5/2002 | Flick |
| 6,397,460 B1 | 6/2002 | Hembree |
| 6,399,900 B1 | 6/2002 | Khoury et al. |
| 6,402,526 B1 | 6/2002 | Schreiber et al. |
| 6,409,521 B1 | 6/2002 | Rathburn |
| 6,420,661 B1 | 7/2002 | Di Stefano et al. |
| 6,420,789 B1 | 7/2002 | Tay et al. |
| 6,420,884 B1 | 7/2002 | Khoury et al. |
| 6,428,328 B2 | 8/2002 | Haba et al. |
| 6,431,881 B1 | 8/2002 | Engbring et al. |
| 6,436,802 B1 | 8/2002 | Khoury |
| 6,437,591 B1 | 8/2002 | Farnworth et al. |
| 6,442,039 B1 | 8/2002 | Schreiber |
| 6,447,305 B1 | 9/2002 | Roberts |
| 6,452,407 B2 | 9/2002 | Khoury et al. |
| 6,454,573 B2 | 9/2002 | Hayashi et al. |
| 6,461,892 B2 | 10/2002 | Beroz |
| 6,465,748 B2 | 10/2002 | Yamanashi et al. |
| 6,472,890 B2 | 10/2002 | Khoury et al. |
| 6,474,997 B1 | 11/2002 | Ochiai |
| 6,492,251 B1 | 12/2002 | Haba et al. |
| 6,497,581 B2 | 12/2002 | Slocum et al. |
| 6,517,362 B2 | 2/2003 | Hirai et al. |
| 6,520,778 B1 | 2/2003 | Eldridge et al. |
| 6,524,115 B1 | 2/2003 | Gates et al. |
| 6,551,112 B1 | 4/2003 | Li et al. |
| 6,558,187 B2 | 5/2003 | Aoki |
| 6,576,485 B2 | 6/2003 | Khoury et al. |
| 6,577,003 B1 | 6/2003 | Crane et al. |
| 6,604,950 B2 | 8/2003 | Maldonado et al. |
| 6,612,861 B2 | 9/2003 | Khoury et al. |
| 6,616,966 B2 | 9/2003 | Mathieu et al. |
| 6,622,380 B1 | 9/2003 | Grigg |
| 6,627,092 B2 | 9/2003 | Clements et al. |

| | | |
|---|---|---|
| 6,640,432 B1 | 11/2003 | Mathieu et al. |
| 6,661,247 B2 | 12/2003 | Maruyama et al. |
| 6,663,399 B2 | 12/2003 | Ali et al. |
| 6,664,131 B2 | 12/2003 | Jackson |
| 6,669,489 B1 | 12/2003 | Dozier, II et al. |
| 6,671,947 B2 | 1/2004 | Bohr |
| 6,672,879 B2 | 1/2004 | Neidich et al. |
| 6,677,245 B2 | 1/2004 | Zhou et al. |
| 6,692,263 B2 | 2/2004 | Villain et al. |
| 6,692,265 B2 | 2/2004 | Kung et al. |
| 6,700,072 B2 | 3/2004 | Distefano et al. |
| 6,701,612 B2 | 3/2004 | Khandros et al. |
| 6,719,569 B2 | 4/2004 | Ochiai |
| 6,730,134 B2 | 5/2004 | Neidich |
| 6,733,326 B2 | 5/2004 | Lee |
| 6,736,664 B2 | 5/2004 | Ueda et al. |
| 6,736,665 B2 | 5/2004 | Zhou et al. |
| 6,749,459 B2 | 6/2004 | Koch et al. |
| 6,750,136 B2 | 6/2004 | Zhou et al. |
| 6,750,551 B1 | 6/2004 | Frutschy et al. |
| 6,763,581 B2 | 7/2004 | Hirai et al. |
| 6,791,171 B2 | 9/2004 | Mok et al. |
| 6,814,584 B2 | 11/2004 | Zaderej |
| 6,814,587 B2 | 11/2004 | Ma |
| 6,815,961 B2 | 11/2004 | Mok et al. |
| 6,821,129 B2 | 11/2004 | Tsuchiya |
| 6,843,659 B2 | 1/2005 | Liao et al. |
| 6,847,101 B2 | 1/2005 | Fjelstad et al. |
| 6,848,173 B2 | 2/2005 | Fjelstad et al. |
| 6,848,929 B2 | 2/2005 | Ma |
| 6,853,210 B1 | 2/2005 | Farnworth et al. |
| 6,857,880 B2 | 2/2005 | Ohtsuki et al. |
| 6,869,290 B2 | 3/2005 | Brown et al. |
| 6,869,307 B2 | 3/2005 | Endo |
| 6,881,070 B2 | 4/2005 | Chiang |
| 6,887,085 B2 | 5/2005 | Hirai |
| 6,898,580 B1 | 5/2005 | Curran et al. |
| 6,898,773 B1 | 5/2005 | Teig et al. |
| 6,902,425 B2 | 6/2005 | Huang |
| 6,916,181 B2 | 7/2005 | Brown et al. |
| 6,920,689 B2 | 7/2005 | Khandros et al. |
| 6,923,656 B2 | 8/2005 | Novotny et al. |
| 6,926,536 B2 | 8/2005 | Ochiai |
| 6,939,143 B2 | 9/2005 | Rathburn |
| 6,957,963 B2 | 10/2005 | Rathburn |
| 6,960,924 B2 | 11/2005 | Akram |
| 6,976,888 B2 | 12/2005 | Shirai et al. |
| 6,980,017 B1 | 12/2005 | Farnworth et al. |
| 6,995,557 B2 | 2/2006 | Goldfine et al. |
| 6,995,577 B2 | 2/2006 | Farnworth et al. |
| 7,001,208 B2 | 2/2006 | Huang |
| 7,002,362 B2 | 2/2006 | Farnworth et al. |
| 7,004,775 B1 | 2/2006 | Sakurai et al. |
| 7,009,413 B1 | 3/2006 | Alghouli |
| 7,021,941 B1 | 4/2006 | Chuang et al. |
| 7,021,970 B2 | 4/2006 | Ozai |
| 7,025,601 B2 | 4/2006 | Dittmann |
| D521,455 S | 5/2006 | Radza |
| D521,940 S | 5/2006 | Radza |
| 7,048,548 B2 | 5/2006 | Mathieu et al. |
| 7,053,482 B2 | 5/2006 | Cho |
| D522,461 S | 6/2006 | Radza |
| D522,972 S | 6/2006 | Long et al. |
| 7,056,131 B1 | 6/2006 | Williams |
| 7,063,560 B2 | 6/2006 | Asao |
| D524,756 S | 7/2006 | Radza |
| 7,070,419 B2 | 7/2006 | Brown et al. |
| 7,074,074 B2 | 7/2006 | Zhang et al. |
| 7,083,425 B2 | 8/2006 | Chong et al. |
| 7,086,869 B1 | 8/2006 | Dangler et al. |
| 7,090,503 B2 | 8/2006 | Dittmann |
| 7,097,496 B2 | 8/2006 | Zhang et al. |
| 7,112,089 B1 | 9/2006 | Liu et al. |
| 7,113,408 B2 | 9/2006 | Brown et al. |
| 7,114,961 B2 | 10/2006 | Williams |
| 7,140,883 B2 | 11/2006 | Khandros et al. |
| 7,189,090 B2 | 3/2007 | Aizawa et al. |
| 7,210,942 B2 | 5/2007 | Uchida et al. |
| 7,238,044 B2 | 7/2007 | Uchida et al. |
| 7,244,125 B2 | 7/2007 | Brown et al. |
| 7,252,540 B2 | 8/2007 | Tanaka |
| 7,261,569 B2 | 8/2007 | Uchida et al. |
| 7,261,595 B2 | 8/2007 | Shino |
| 7,263,771 B2 | 9/2007 | Ochiai |
| 7,285,015 B2 | 10/2007 | Helbok et al. |
| 2001/0001080 A1 | 5/2001 | Eldridge et al. |
| 2001/0024890 A1 | 9/2001 | Maruyama et al. |
| 2002/0006744 A1 | 1/2002 | Tashiro |
| 2002/0008966 A1 | 1/2002 | Fjelstad et al. |
| 2002/0011859 A1 | 1/2002 | Smith et al. |
| 2002/0055282 A1 | 5/2002 | Eldridge et al. |
| 2002/0055289 A1 | 5/2002 | Murakami et al. |
| 2002/0058356 A1 | 5/2002 | Oya |
| 2002/0079120 A1 | 6/2002 | Eskildsen et al. |
| 2002/0117330 A1 | 8/2002 | Eldridge et al. |
| 2002/0129866 A1 | 9/2002 | Czebatul et al. |
| 2002/0129894 A1 | 9/2002 | Liu et al. |
| 2002/0133941 A1 | 9/2002 | Akram et al. |
| 2002/0146919 A1 | 10/2002 | Cohn |
| 2002/0178331 A1 | 11/2002 | Beardsley et al. |
| 2003/0000739 A1 | 1/2003 | Frutschy et al. |
| 2003/0003779 A1 | 1/2003 | Rathburn |
| 2003/0022503 A1 | 1/2003 | Clements et al. |
| 2003/0035277 A1 | 2/2003 | Saputro et al. |
| 2003/0049951 A1 | 3/2003 | Eldridge et al. |
| 2003/0064635 A1 | 4/2003 | Ochiai |
| 2003/0089936 A1 | 5/2003 | McCormack et al. |
| 2003/0092293 A1 | 5/2003 | Ohtsuki et al. |
| 2003/0096512 A1 | 5/2003 | Cornell |
| 2003/0099097 A1 | 5/2003 | Mok et al. |
| 2003/0129866 A1 | 7/2003 | Romano et al. |
| 2003/0147197 A1 | 8/2003 | Uriu et al. |
| 2003/0194832 A1 | 10/2003 | Lopata et al. |
| 2004/0029411 A1 | 2/2004 | Rathburn |
| 2004/0033717 A1 | 2/2004 | Peng |
| 2004/0072467 A1 | 4/2004 | Jordan et al. |
| 2004/0118603 A1 | 6/2004 | Chambers |
| 2004/0127073 A1 | 7/2004 | Ochiai |
| 2005/0088193 A1 | 4/2005 | Haga |
| 2005/0142900 A1 | 6/2005 | Boggs et al. |
| 2005/0167816 A1 | 8/2005 | Khandros et al. |
| 2005/0208788 A1 | 9/2005 | Dittmann |
| 2005/0287828 A1 | 12/2005 | Stone et al. |
| 2006/0028222 A1 | 2/2006 | Farnworth et al. |
| 2006/0121756 A1 | 6/2006 | Kuo et al. |
| 2006/0276059 A1 | 12/2006 | Dittmann et al. |
| 2006/0281361 A1 | 12/2006 | Uchida et al. |
| 2007/0054544 A1 | 3/2007 | Hirata |
| 2007/0054545 A1 | 3/2007 | Takahira |
| 2007/0105433 A1 | 5/2007 | Shioda et al. |
| 2007/0123074 A1 | 5/2007 | Nishimura |
| 2007/0134949 A1 | 6/2007 | Dittmann |
| 2007/0178751 A1 | 8/2007 | Yamamoto |
| 2007/0275579 A1 | 11/2007 | Si et al. |
| 2008/0045076 A1 | 2/2008 | Dittmann et al. |
| 2008/0050958 A1 | 2/2008 | Hashiguchi et al. |
| 2008/0076282 A1 | 3/2008 | Yamaji et al. |

FOREIGN PATENT DOCUMENTS

| | | |
|---|---|---|
| EP | 0692823 B1 | 2/2003 |
| EP | 1005086 B1 | 9/2003 |
| EP | 0839321 B1 | 1/2006 |
| JP | 2000-114433 | 4/2000 |
| JP | 2001-203435 | 7/2001 |
| WO | WO-9602068 A1 | 1/1996 |

| | | |
|---|---|---|
| WO | WO-9743653 A1 | 11/1997 |
| WO | WO-9744859 A1 | 11/1997 |
| WO | WO-0213253 A1 | 2/2002 |
| WO | WO-2005034296 A1 | 4/2005 |
| WO | WO-2005036940 A1 | 4/2005 |
| WO | WO-2005067361 | 7/2005 |
| WO | WO-2005067361 A1 | 7/2005 |

OTHER PUBLICATIONS

Mahajan, Ravi et al., "Emerging Directions for packaging Technologies", *Intel Technology Journal* V. 6, Issue 02, (May 16, 2002),62-75 Pgs.

Williams, John D., "Contact Grid Array System", *Patented Socketing System for the BGA/CSP Technology*, E-tec Interconnect Ltd.,(Jun. 2006),1-4 Pgs.

SYSTEM AND METHOD FOR CONNECTING FLAT FLEX CABLE WITH AN INTEGRATED CIRCUIT, SUCH AS A CAMERA MODULE

CROSS REFERENCE TO RELATED APPLICATIONS

This application is a continuation of co-pending U.S. patent application Ser. No. 11/408,566 filed Apr. 21, 2006, an application which was a continuation-in-part of U.S. patent application Ser. No. 11/265,205 filed on Nov. 3, 2005 (and issued as U.S. Pat. No. 7,114,961 on Oct. 3, 2006) which was a continuation-in-part of U.S. patent application Ser. No. 10/412,729 filed Apr. 11, 2003 (and issued as U.S. Pat. No. 7,056,131 on Jun. 6, 2006). The benefit of the filing dates of these earlier patents and patent applications is requested under 35 USC 120.

FIELD OF INVENTION

This invention relates to flat or planar flexible carrier or cable with embedded electrical connectors that serves to connect devices such as camera modules used in mobile telephones to electrical circuits.

BACKGROUND OF THE INVENTION

There is a need to provide flexible electrical connectors in tight spaces, between components on different planes or axis and where the components to be connected are not easily attached one to another. Connectors typically have been sockets or pins attached to flat flexible cables (FFC) that plug into an electrical device to complete electrical circuits. These connectors have a housing or support structure that is physically attached to the FFC. These structures take up space because they have support structures for the pins or sockets that add to the thickness of the FFC. Failure of the electrical circuit at the point of connection between the existing connectors and the FFC causes failure of the devices in which they are installed. A simple integrated connector with the FFC is needed to solve the space and failure problem and to save processing steps and materials.

DESCRIPTION OF THE INVENTION

One form of the invention uses embedded contacts on a flat flexible cable (FFC) to attach complimentary metal oxide silicon (CMOS) or charged coupled device (CCD) camera module at one end of the FFC to electrical components at the other end of the FFC. These electrical components may be a printed circuit Board (PCB), semiconductor or like devices. Also electrical subsystems may be attached to or embedded with contacts that are embedded on or in a FFC.

FFC is readily available in various configurations from vendors such as Luxida™ Corporation. It is typically made by sandwiching conductive material such as copper in strips, also known as traces, between flexible insulators. The insulation may be stripped from the FFC to provide areas in which the traces are exposed allowing electrical contact. In the present invention electrical connectors are directly adhered onto the exposed traces.

Figure 1:
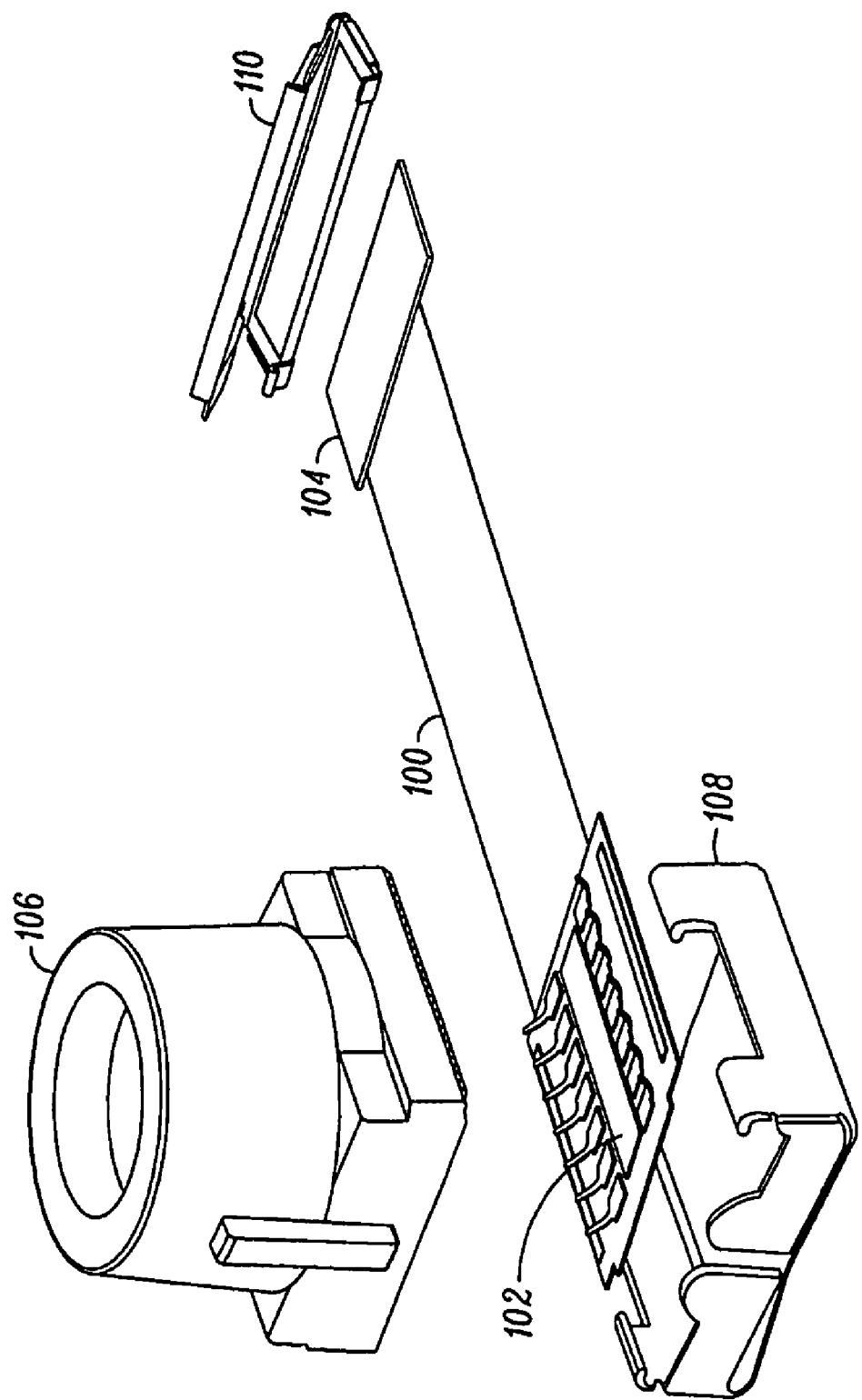
FIG. 1, is a Schematic of a flat flex cable with embedded electrical contacts at either end, one end is aligned with a camera module and fixture for receiving the module and clamping the electrical contacts into engagement with the module and the other end is aligned to be engaged in a clamping device to make electrical contact to a circuit.

Referring to FIG. 1, FFC 100 has an electrical connector array 102 at one end and an electrical connector array 104 at its other end on an opposing surface of FFC 100 to that of electrical connector array 102. In this instance the connector array 102, 104 are spring flanges. Both connector arrays 102, 104 are configured on the FFC 100 by a technique further described herein to electrically connect to traces (not shown) in FFC 100 to create an electrical path. One connector array 102 is positioned to engage a camera module 106 of the kind that is now used in cell phones and similar devices. On at least one external area of the camera module 106 are electrical connectors. A clamping device 108 receives the connector array 102 positioned so that the electrical connectors are aligned with the electrical connectors on the camera module 106. The camera module 106 is then inserted into the clamping device 108 holding the electrical connector array 102 to make an electrical connection with the electrical connectors in camera module 106. Clamping devices may be eliminated in instances where the connector is held in place by forces applied by or through the electrical device to which it connects or compression applied by adjoining devices or support structure.

The connector array 104 on the other end of flex cable 100 may be secured via a clamp 110 to an electrical circuit, component or device (not shown) such as a printed circuit board, semiconductor device, or like electrical circuit. The resulting flexible assembly allows electrical connections in varying spatial and component configurations.

Figure 2:
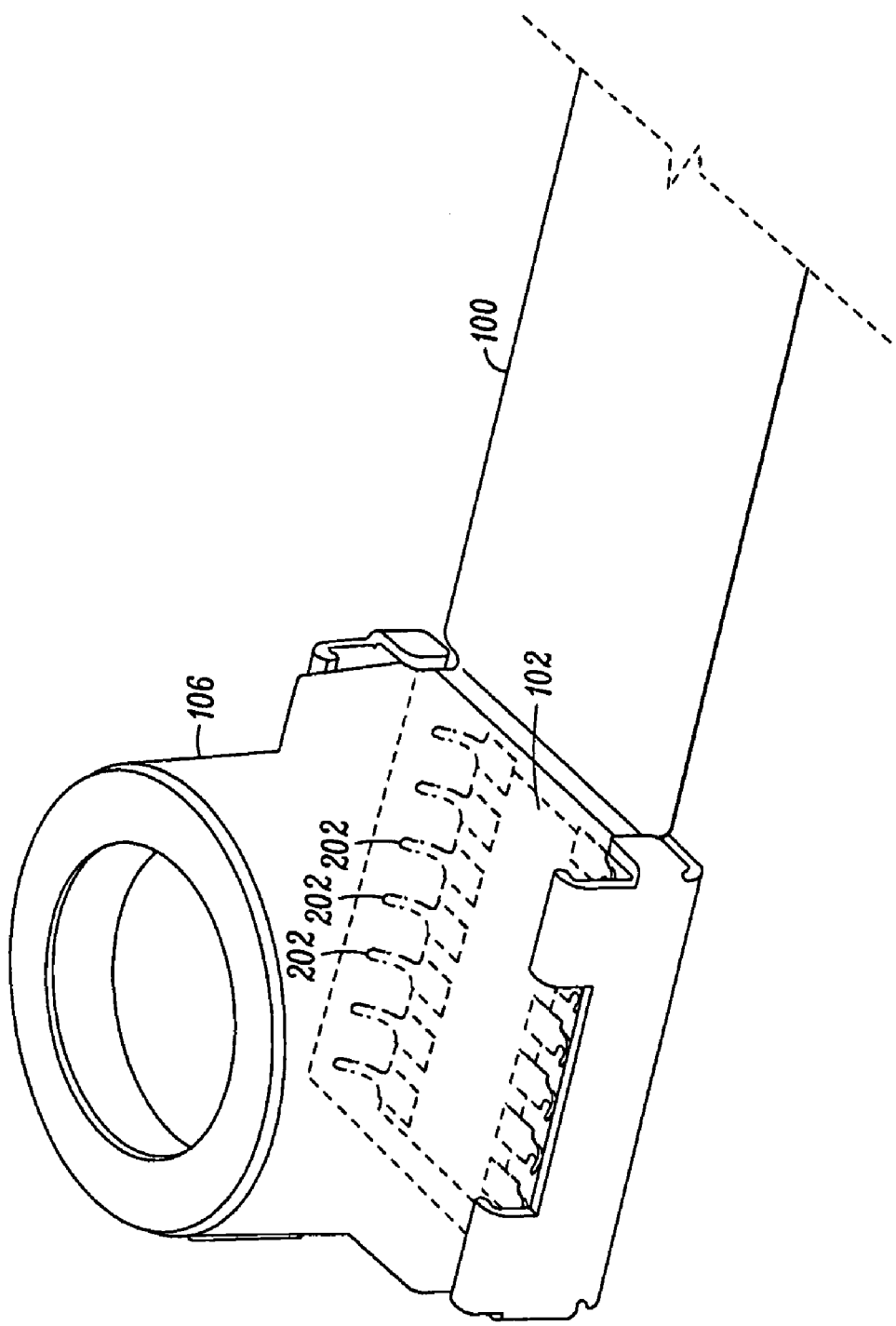
FIG. 2, is a transparent view of a camera module clamped to an array of spring connectors on a flat flex cable to make electrical contact with electrical contacts on the camera module.

FIG. 2, is a transparent view of camera module 106 that is clamped onto FFC 100 and engages connector array 102 with contacts (not shown) on camera module 106. The clamping action compresses the spring contacts 202 on connector array 102 to make mechanical and electrical contact.

Figure 3:
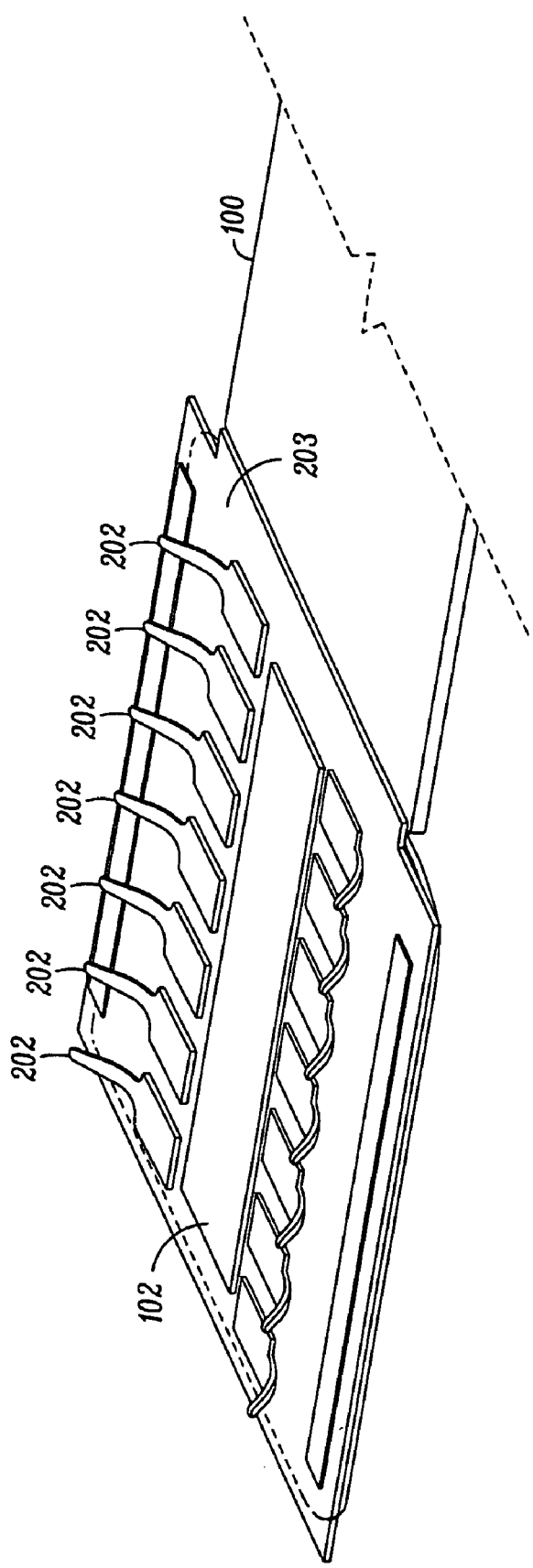
FIG. 3, is a perspective view of embedded contacts on a flat flex cable.

Referring to FIG. 3, electrical connector array 102 has a series of spring contacts 202 formed in three dimensions that extend from the plane of the connector array 102 formed on FFC 100. The arrangement of the contacts 202 are for illustrative purpose only and may be in any suitable shape, number and material. For instance, the connectors 102 could be in the shape of interleaved arms or helixes. Electrical traces, not shown, in FFC 100 connect to spring contacts 202. The electrical connector array 102 may have a support backing 203 for the connector array 102. The support bracket 203 is typically made from an insulation material. It could also have a composition of materials to provide electrical shielding.

Neoconix invented a process for forming electrical contacts in three dimensions using techniques similar to that used to make printed circuit boards as more fully described in U.S. Pat. Nos. 6,916,181; 6,869,290 and U.S. patent application Ser. No. 11/1265,205 filed on Nov. 3, 2005 and Ser. No. 10/412,729 filed on Apr. 11, 2003. The process comprises attaching a sheet of conductive material to a substrate, masking the sheet and chemically etching it, or other techniques, to predetermined shape and isolating, also known as singulating, the resulting contacts from each other. An electrical connection may be made between the contacts and circuits on, through or within the substrate by plating or mechanical connections.

Figure 4:
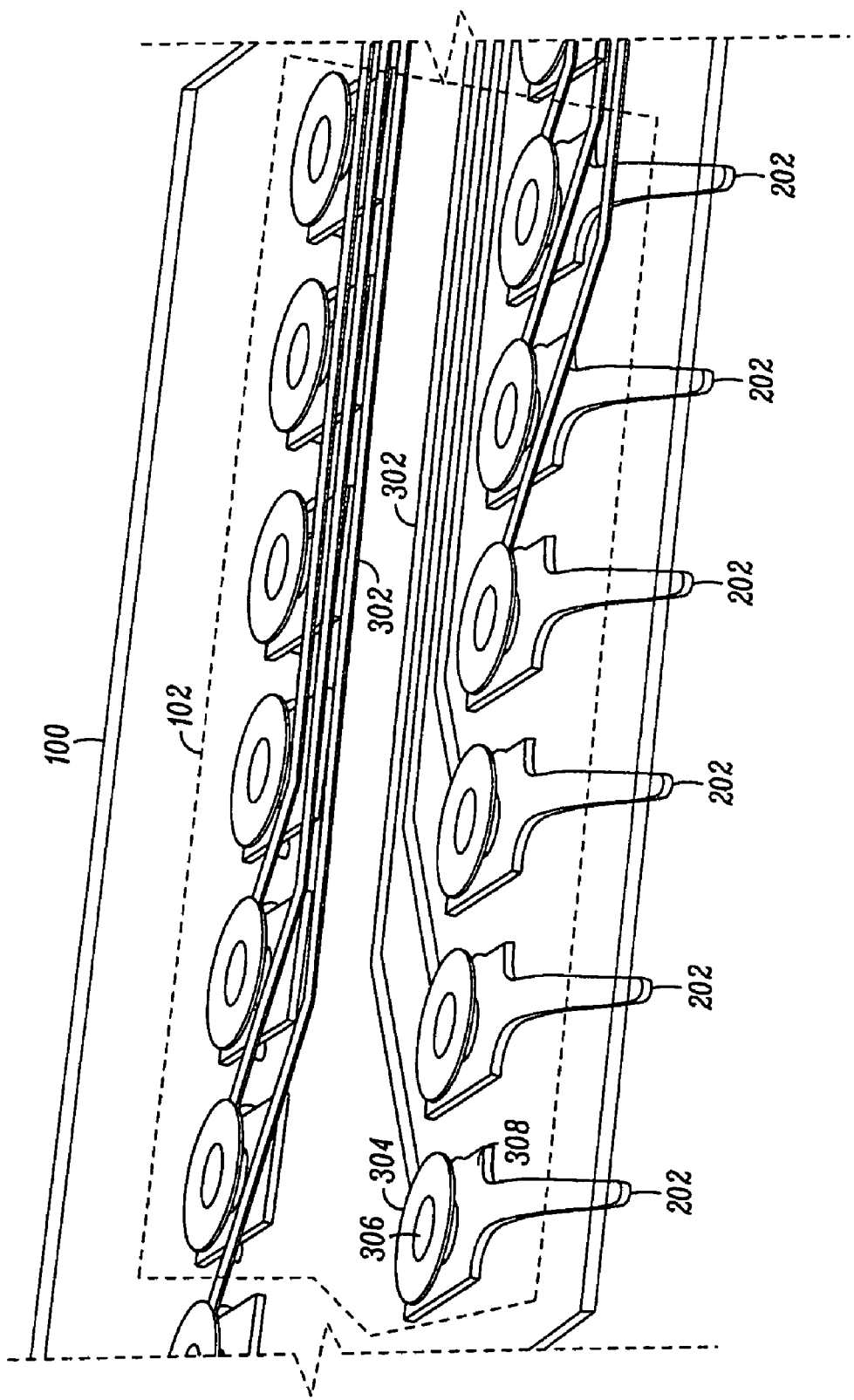
FIG. 4, is a transparent schematic view of a contact spring array connected to electrical traces embedded on or in flat flex cable.

FIG. 4 is an exploded transparent schematic view showing spring contacts 202 in an array of contacts 102 mounted on FFC 100 exposing the electrical traces 302 within the FFC 100. The traces 302 terminate in a base 304 that has vias 306 that are typically subsequently plated with metal or alloys of metal to connect the trace base 304 with the base 308 of spring 202 typically on a surface of FFC 100. The base 304, via 306 and spring base 308 may also be electrically connected by mechanical contact or adhesives or a combination thereof.

In this invention, electrical contacts, in the form of spring flanges 202 or other shapes are formed directly onto the exposed electrical traces 302 in the FFC 100. In the forming process, a sheet of conductive material, nominally BeCu is adhered to the FFC 100 in registration with the electrical traces 302. The sheet is then masked and etched to form spring flanges 202 and then the resulting flanges are chemically etched, or other techniques may be used, to electrically isolate them from each other which is a process also known as singulation. This produces FFC 100 with embedded spring flanges 202 electrically and structurally connected to the electrical traces 302.

Figure 5:
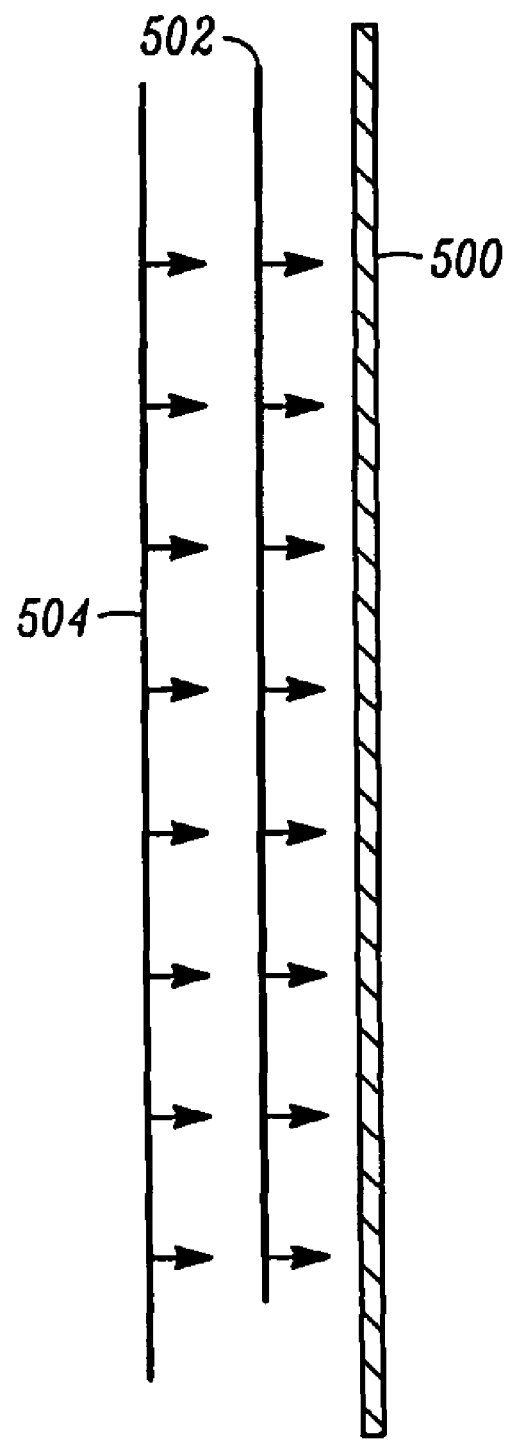
FIG. 5, is a side view of a BeCu sheet, laminate material and FFC.

Referring to FIG. 5, a sheet of beryllium copper (BeCu) 504 is laminated onto a flex material 500 using a sheet of laminated material 502 that is typically acrylic to affect the lamination. The sheet of BeCu 504 extends beyond an end of the laminate 502. This allows the sheet of BeCu 504 to be formed into a spring contact 202 before or after the process of lamination by the BeCu 504 into a spring shape.

Figure 6:
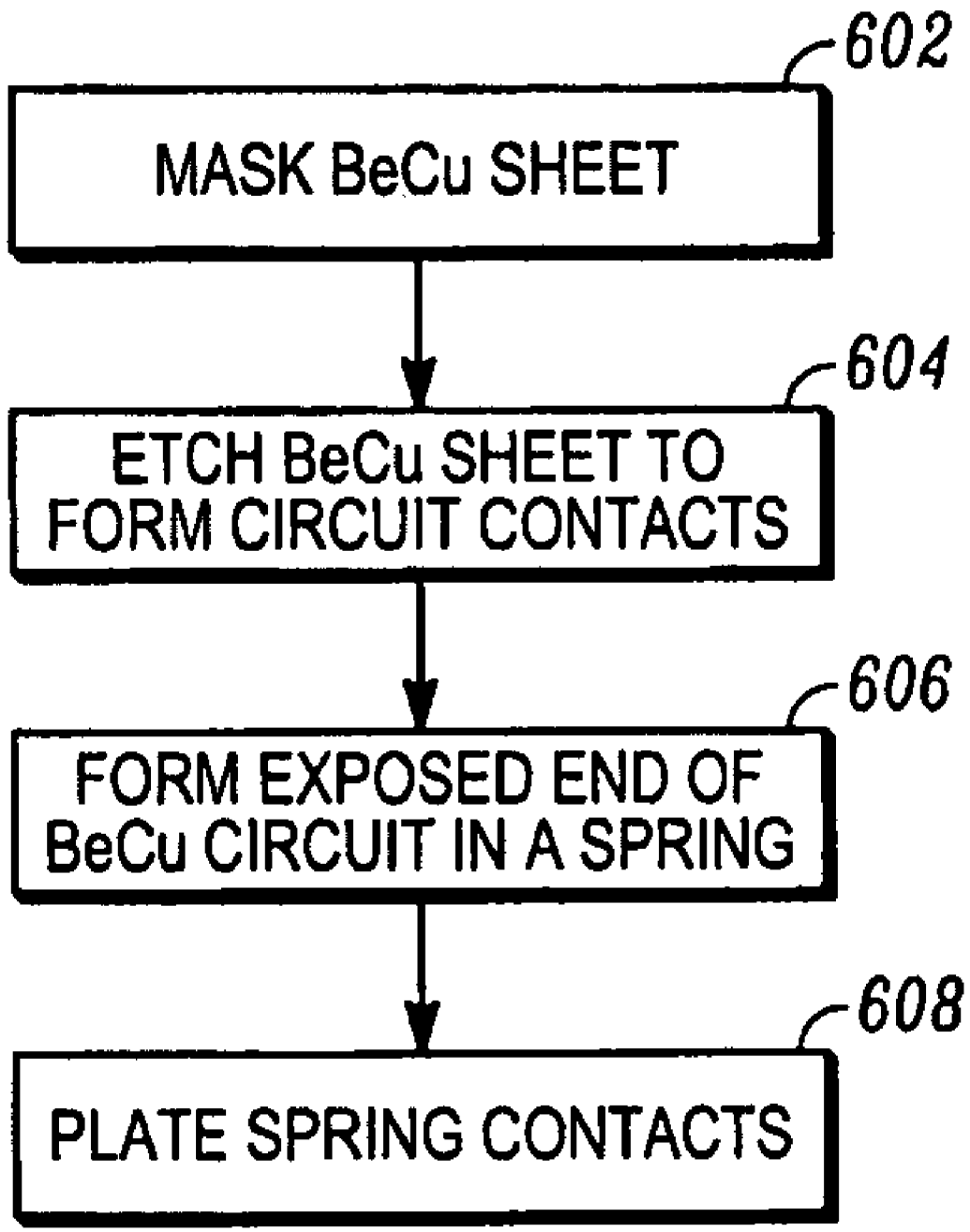
FIG. 6, is the process flow for forming integral circuits and spring contacts on a FFC.

Referring to FIG. 6, the process of circuitizing and forming spring contact is performed on the laminated BeCu 504 and flex material 500 by masking 602 the BeCu 504 to define one or more circuits and lithographically etching 604 the circuits and contacts. The contacts may be plated 608 and then formed 606 to create the final contacts 202.

Figure 7:
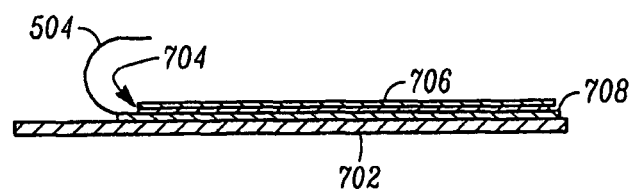
FIG. 7, is a side view of a FFC with exposed trace elements formed into spring contacts.

FIG. 7 is a side view of a FFC that has the exposed BeCu 504 formed into a spring contact. A sheet of BeCu 504 or similar material is adhered to flex material 702 by use of a lamination sheet 708. The BeCu sheet 504 has been formed into circuits by the process described in the previous paragraph. A second insulation sheet 706 is adhered to the circuitized BeCu 504 and underlying flex 702 by an adhesive sheet 704 to form an encapsulated circuit with exposed ends of BeCu 504. These exposed ends may then be formed into spring contacts. Another process is to solder or weld the contacts 202 directly onto the circuitry on the flex 100.

Yet another variation of the process to manufacture FFC is to use build up techniques described above to embed conductive material that terminates in pads on which to mount spring contacts in layers of flexible dielectric materials. Circuits are formed on flex material with surface mount pads at a terminus and spring contacts are laminated onto the pads by adhesives, typically acrylic. The springs and pads are then plated to form an integral structure. The construction of these pads as part of the manufacture of the flat flex material eliminates the steps of stripping the insulation away from the conductive traces and bonding pads to the terminus of the traces.

Figure 8:
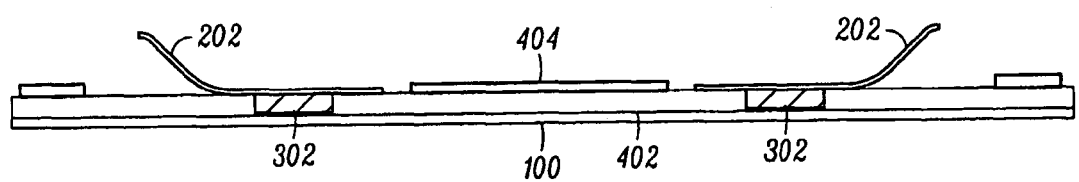
FIG. 8, is a cross section view of a flat flex cable with embedded contacts.

Referring to FIG. 8, a section of FFC 100 is shown in cross section with electrical traces 302 sandwiched between the insulator layers 402, 404. The FFC 100 can also be made with the traces 302 embedded within insulation that is formed as one piece rather than layered. Portions of insulator 404 are removed to expose traces 302. Springs 202 are attached to the traces 302 by the process described above for making electrical connectors in three dimensions.

Figure 9:
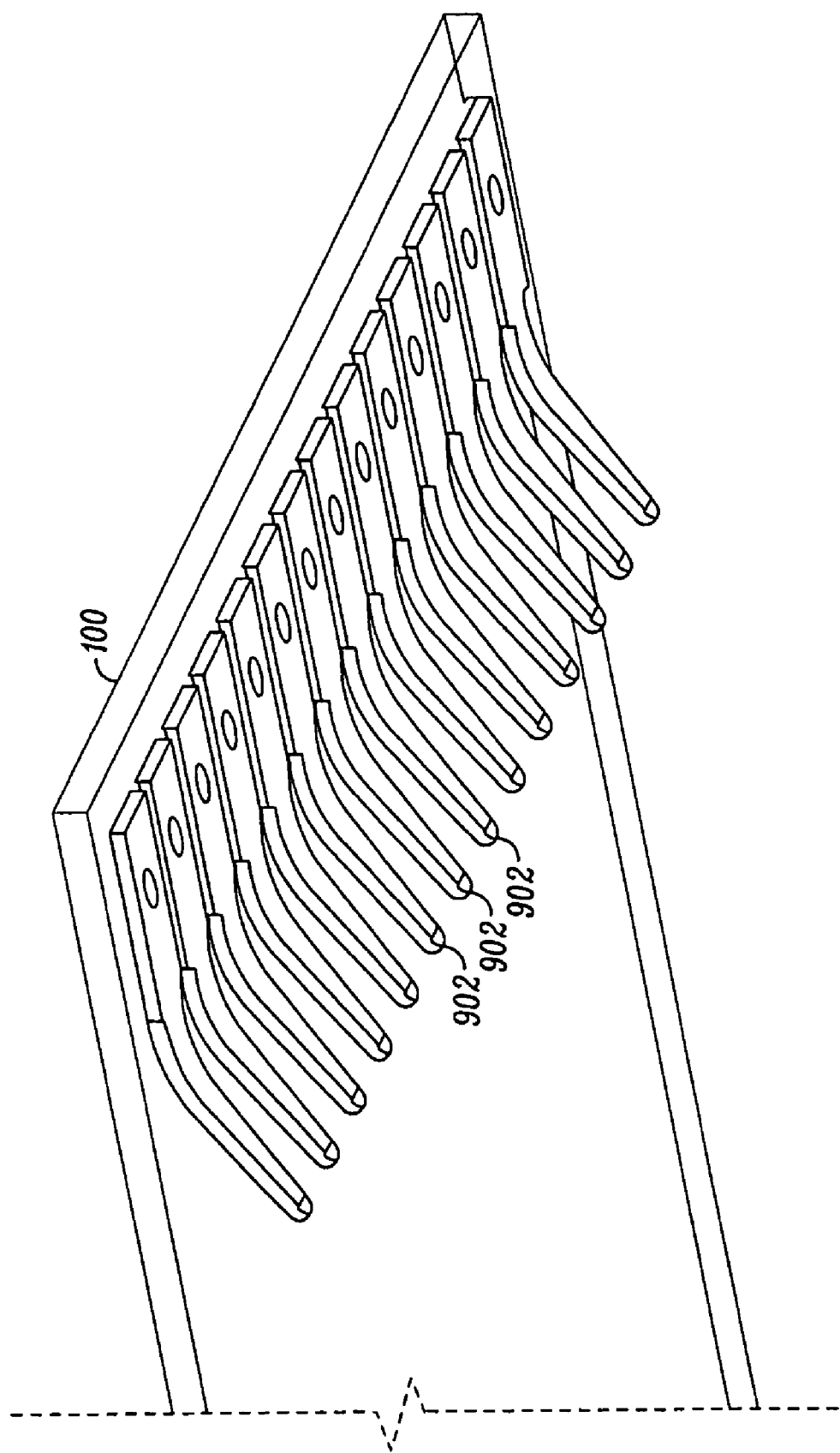
FIG. 9, is a view of embedded contacts on an end of flat flex cable.

Referring to FIG. 9, in one configuration of the invention electrical spring contacts 902 are formed at the end of FFC 100 opposite to camera module 106 (not shown) by the method for making electrical connectors in three dimensions described herein. The spring contacts 902 are attached to the FFC 100 traces conductors 302 by either stripping insulators 402 or 404 and attaching the contacts 202 to the exposed conductor traces 302 or by forming the FFC 100 and spring contacts 902 by the process for making contacts in three dimensions described herein.

The FFC 100 can be manufactured by embedding trace conductors 302 in FFC 100 and forming the spring contacts 902 onto FFC 100. The result is an electrical circuit beginning at the electrical contacts on camera module 106 (not shown) through spring flanges 202 via trace conductors 302 to contacts 902 at the other end of flat flex cable 100. The contacts 902 may then be engaged by a clamp, not shown, to make electrical connection to an electrical device such as a printed circuit board, semiconductor or like structure.

This invention may be implemented in variations of steps, configurations, shapes, sizes and materials all of which are contemplated herein.

The invention claimed is:

1. An electrical connector carried on a flat flex cable having a plurality of electrical traces for coupling the electric traces on the flat flex cable to electrical contacts carried on an electronic module, the electrical connector comprising: a conductive sheet adhered to the flat flex cable, the conductive sheet including a plurality of spring contacts formed from a single sheet by masking the sheet, etching a portion of the masked sheet and singulating the sheet to separate the spring contacts; the spring contacts being coupled to the plurality of electrical traces in the flat flex cable; and the spring contacts arranged to mate with the electrical contacts on the electronic module to form an electrical connection between the electrical traces on the flat flex cable and the electrical contacts of the electronic module.

2. An electrical connector of the type described in claim 1 wherein at least one of the spring contacts has been formed into three dimensions.

3. An electrical connector of the type described in claim 1 wherein at least one of the spring contacts has been plated.

4. An electrical connector of the type described in claim 1 wherein the electronic module comprises a camera module with electrical contacts and the spring contacts are coupled to electrical contacts on the camera module without a clamp.

5. An electrical connector of the type described in claim 1 wherein at least one of the spring contacts has been formed into three dimensions and plated and the electrical contacts on the electronic module are coupled to the spring contacts without a clamp.

6. A method of making an electrical connection between an electronic module having electrical contacts and a flat flex cable having one or more electrical traces comprising steps of: adhering a conductive sheet to the one or more electrical traces on the flat flex cable; forming spring contacts on the conductive sheet by masking the sheet to predetermined shape of spring contacts and etching the masked sheet to define the spring contacts; singulating the conductive sheet to form a plurality of spring contacts; and engaging the spring contacts adhered to the flat flex cable with the electrical contacts on the electronic module.

7. A method including the steps of claim 6 wherein the step of forming spring contacts further includes a step of forming at least one of the spring contacts into three dimensions.

8. A method including the steps of claim 6 wherein the step of forming spring contacts further includes a step of plating a portion of at least one spring contact.

9. A method including the steps of claim 6 wherein the step of engaging the electrical contacts on the electronic module further includes engaging the electrical contacts on a camera module.

* * * * *